United States Patent
Kim

(10) Patent No.: US 9,664,935 B2
(45) Date of Patent: May 30, 2017

(54) METHOD OF MANUFACTURING FLEXIBLE DISPLAY PANEL AND METHOD OF MANUFACTURING FLEXIBLE DISPLAY APPARATUS

(71) Applicant: Samsung Display Co., LTD., Yongin, Gyeonggi-Do (KR)

(72) Inventor: Sun-Ho Kim, Seongnam-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 182 days.

(21) Appl. No.: 14/303,909

(22) Filed: Jun. 13, 2014

(65) Prior Publication Data
US 2015/0129122 A1 May 14, 2015

(30) Foreign Application Priority Data
Nov. 11, 2013 (KR) .................. 10-2013-0136582

(51) Int. Cl.
| | | |
|---|---|---|
| *G02F 1/1333* | (2006.01) | |
| *H01L 51/00* | (2006.01) | |
| *B32B 37/12* | (2006.01) | |
| *B32B 38/10* | (2006.01) | |
| *B32B 37/18* | (2006.01) | |

(52) U.S. Cl.
CPC .... *G02F 1/133305* (2013.01); *B32B 37/1284* (2013.01); *H01L 51/003* (2013.01); *H01L 51/0097* (2013.01); *B32B 37/18* (2013.01); *B32B 38/10* (2013.01); *B32B 2315/00* (2013.01); *B32B 2315/02* (2013.01); *B32B 2457/20* (2013.01); *Y02E 10/549* (2013.01); *Y02P 70/521* (2015.11); *Y10T 156/10* (2015.01)

(58) Field of Classification Search
CPC ............ B32B 2457/20; B32B 37/1284; B32B 2315/02; B32B 2315/00; G02F 1/133305; H01L 51/003; H01L 51/0097; B29D 11/0073
USPC ................................ 156/325, 247, 758, 707
See application file for complete search history.

(56) References Cited

U.S. PATENT DOCUMENTS

| | | | |
|---|---|---|---|
| 6,818,310 B2 | 11/2004 | Namiki et al. | |
| 7,951,687 B2 | 5/2011 | Giesbers et al. | |
| 8,053,082 B2 | 11/2011 | Hashimoto et al. | |
| 8,067,802 B2 | 11/2011 | Dekker et al. | |

(Continued)

FOREIGN PATENT DOCUMENTS

| | | | |
|---|---|---|---|
| KR | 10-1149433 B1 | 5/2012 | |
| WO | 2012/049419 A2 | 4/2012 | |
| WO | WO 2013119737 A2 * | 8/2013 | ............ B32B 7/06 |

OTHER PUBLICATIONS

Mack et al., "Gas development at the interface of directly bonded silicon wafers: investigation on silicon-based pressure sensors", Sensors and Actuators, A 56, 1996, pp. 273-277.

*Primary Examiner* — Philip Tucker
*Assistant Examiner* — Jimmy R Smith, Jr.
(74) *Attorney, Agent, or Firm* — Cantor Colburn LLP

(57) ABSTRACT

A method of manufacturing a flexible display panel includes forming an adhesive layer by depositing an inorganic material on a flexible substrate, forming a hydroxyl group on a surface of the adhesive layer by modifying the surface of the adhesive layer, laminating a glass substrate to the modified surface of the adhesive layer and forming a heat-treated layer by heating the glass substrate and the adhesive layer.

20 Claims, 10 Drawing Sheets

(56) References Cited

U.S. PATENT DOCUMENTS

| | | | |
|---|---|---|---|
| 8,241,972 B2 | 8/2012 | Wang et al. | |
| 8,246,894 B2 | 8/2012 | Kim et al. | |
| 2008/0309867 A1* | 12/2008 | Kampstra | C03C 27/06 349/158 |
| 2009/0323009 A1* | 12/2009 | Paek | G02F 1/133305 349/160 |
| 2011/0023672 A1* | 2/2011 | Blanchard | B32B 43/006 83/15 |
| 2011/0052836 A1* | 3/2011 | Kim | H01L 51/52 428/1.1 |
| 2011/0092006 A1* | 4/2011 | An | B29D 11/0073 438/29 |
| 2011/0123787 A1* | 5/2011 | Tomamoto | C03C 17/3411 428/212 |
| 2012/0235315 A1 | 9/2012 | Wu et al. | |
| 2013/0284353 A1* | 10/2013 | Brainard | B32B 38/10 156/247 |
| 2013/0302627 A1* | 11/2013 | Roehrig | B32B 27/308 428/447 |
| 2014/0170378 A1* | 6/2014 | Bellman | C03C 17/002 428/141 |
| 2014/0290732 A1* | 10/2014 | Aizenberg | A61L 15/24 136/256 |

* cited by examiner

METHOD OF MANUFACTURING FLEXIBLE DISPLAY PANEL AND METHOD OF MANUFACTURING FLEXIBLE DISPLAY APPARATUS

This application claims priority to Korean Patent Application No. 10-2013-0136582, filed on Nov. 11, 2013, and all the benefits accruing therefrom under 35 U.S.C. §119, the disclosure of which is incorporated by reference herein in its entirety.

BACKGROUND (1) Field

Exemplary embodiments relate to a method of manufacturing a flexible display panel and a method of manufacturing a flexible display apparatus including the flexible display panel. More particularly, exemplary embodiments relate to a method of manufacturing a flexible display panel and a method of manufacturing a flexible display apparatus having improved display quality.

(2) Description of the Related Art

A flexible display apparatus includes a flexible display panel. The flexible display panel includes a flexible substrate including an organic material. Generally, the flexible display apparatus has a light weight, a high impact resistance and may be folded or rolled to store, so that the flexible display apparatus has an excellent portability.

A flexible display panel of the flexible display apparatus includes a display layer having a display element disposed on a flexible substrate. The display layer may be an organic emitting display layer, a liquid crystal display layer, an electrophoresis display layer, etc. The display element may include a thin-film transistor, and the thin-film transistor may be formed on the flexible substrate by a plurality of thin-film processes.

SUMMARY

Generally, a cross-sectional thickness of a flexible substrate of a flexible display panel is relatively thin, so that the flexible display panel is formed by separating the flexible substrate from a supporting glass substrate after forming display elements of the flexible display panel on the flexible substrate by thin film processes.

An adhesive material is applied to the flexible substrate and/or the glass substrate to form an adhesive layer therebetween. The adhesive layer includes an organic material, so that the adhesive layer has a low heat resistance. Thus, a gas in the adhesive layer may be generated, so that bubbles on the flexible substrate may occur and the flexible substrate may burst or be torn. Therefore, a display quality of the flexible display apparatus including the flexible substrate which bursts or is torn may decrease.

One or more exemplary embodiment provides a method of manufacturing a flexible display panel having improved display quality.

One or more exemplary embodiment also provides a method of manufacturing a flexible display apparatus including a flexible display panel.

In accordance with an exemplary embodiment, a method of manufacturing a flexible display panel, includes forming an adhesive layer by depositing an inorganic material on a flexible substrate, forming a hydroxyl group on a surface of the adhesive layer by modifying the surface of the adhesive layer, laminating a glass substrate to the modified surface of the adhesive layer and forming a heat-treated layer by heating the glass substrate and the adhesive layer.

In an exemplary embodiment, forming the adhesive layer may include laminating the flexible substrate to a carrier substrate, depositing the inorganic material to the flexible substrate laminated to the carrier substrate to form the adhesive layer, and separating the flexible substrate with the adhesive layer thereon from the carrier substrate.

In an exemplary embodiment, the forming the adhesive layer may include unwinding flexible substrate material for the flexible substrate from a first roller, depositing the inorganic material to the unwound flexible substrate material to form the adhesive layer and winding the flexible substrate material with the adhesive layer thereon to a second roller.

In an exemplary embodiment, the inorganic material may include silicon oxide.

In an exemplary embodiment, the inorganic material may include aluminum oxide, gallium oxide, zinc oxide, titanium dioxide, indium oxide, indium tin oxide, indium zinc oxide, gallium indium zinc oxide or a combination thereof.

In an exemplary embodiment, a thickness of the adhesive layer may be within a range of about 10 angstroms (Å) to about 5000 Å.

In an exemplary embodiment, a surface roughness of the adhesive layer may be less than about 5 nanometers (nm).

In an exemplary embodiment, a processing temperature of the forming a heat-treated layer may be within a range of about 100 Celsius (° C.) to about 450° C.

In an exemplary embodiment, the method may further include separating the flexible substrate from the adhesive layer.

In an exemplary embodiment, the modified surface of the adhesive layer may include 5 hydroxyl groups in 1 square nanometer ($nm^2$).

In an exemplary embodiment, the flexible substrate and the adhesive layer may be separated by irradiating a laser.

In an exemplary embodiment, the modified surface of the adhesive layer may include hydroxyl groups within a range of about 1 hydroxyl group to about 4 hydroxyl groups in 1 $nm^2$.

In an exemplary embodiment, an adhesive strength between the flexible substrate and the adhesive layer may be less than about 30 grams-force per square centimeter (gf/$cm^2$).

In an exemplary embodiment, the flexible substrate and the adhesive layer may be separated by applying force in opposite directions with a vacuum state.

In accordance with an exemplary embodiment, a method of manufacturing a flexible display apparatus includes forming an adhesive layer by depositing an inorganic material on a first surface of flexible substrate, forming a hydroxyl group on a surface of the adhesive layer by modifying the surface of the adhesive layer, laminating a glass substrate to the modified surface of the adhesive layer, forming a heat-treated layer between the first surface of the flexible substrate and the glass substrate by heating the glass substrate and the adhesive layer with the hydroxyl group on the surface thereof and the glass substrate, and forming a display layer including a display element on a second surface of the flexible substrate opposite to the first surface, with the heat-treated layer between the first surface of the flexible substrate and the glass substrate.

In an exemplary embodiment, the method may further include forming an encapsulating layer on the display layer to cover the display element, with the heat-treated layer between the first surface of the flexible substrate and the glass substrate.

In an exemplary embodiment, the method may further include separating the flexible substrate and the adhesive layer, after the forming the encapsulating layer.

In an exemplary embodiment, the inorganic material may include silicon oxide.

In an exemplary embodiment, the inorganic material may include aluminum oxide, gallium oxide, zinc oxide, titanium dioxide, indium oxide, indium tin oxide, indium zinc oxide, gallium indium zinc oxide or a combination thereof.

In an exemplary embodiment, the display element may include an organic emitting display element, a liquid crystal display element, an electrophoresis display element or a combination thereof.

In accordance with one or more exemplary embodiment, an adhesive layer is formed by depositing an inorganic material on a flexible substrate for a display panel, so that a defect of the flexible substrate caused by out-gassing from the adhesive layer may be reduced or effectively prevented. A supporting glass substrate is laminated to the flexible substrate via the adhesive layer. Furthermore, a portion of a display panel including the flexible substrate is heat-treated to form a heat-treated layer between the adhesive layer and the glass substrate, so that an adhesive strength between the flexible substrate and the glass substrate may be strengthened for further processes forming elements of the display panel on the flexible substrate.

BRIEF DESCRIPTION OF THE DRAWINGS

The invention will become more apparent by describing in detailed exemplary embodiments thereof with reference to the accompanying drawings, in which.

DETAILED DESCRIPTION

Figure 1A:
FIGS. 1A to 1E are cross-sectional views illustrating an exemplary embodiment of a method of forming an adhesive layer on a flexible substrate.

The invention is described more fully hereinafter with reference to the accompanying drawings, in which exemplary embodiments of the invention are shown. This invention may, however, be embodied in many different forms and should not be construed as limited to the exemplary embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on," "connected to" or "coupled to" another element or layer, the element or layer can be directly on, connected or coupled to another element or layer or intervening elements or layers. In contrast, when an element is referred to as being "directly on," "directly connected to" or "directly coupled to" another element or layer, there are no intervening elements or layers present. As used herein, connected may refer to elements being physically and electrically connected to each other. Like numbers refer to like elements throughout. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the invention.

Spatially relative terms, such as "lower," "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "upper" relative to other elements or features would then be oriented "upper" relative to the other elements or features. Thus, the exemplary term "under" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used in this specification, specify the presence of stated features, integers, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

Hereinafter, exemplary embodiments will be described in detail with reference to the accompanying drawings.

FIGS. 1A to 1E are cross-sectional views illustrating an exemplary embodiment of a method of forming an adhesive layer on a flexible substrate.

Figure 1B:
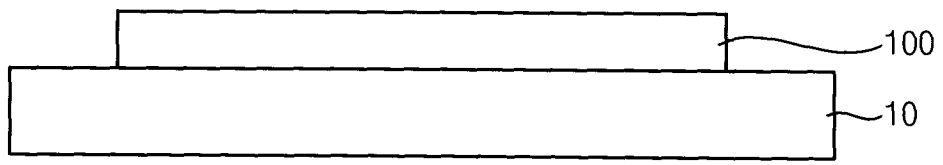
Figure 1C:
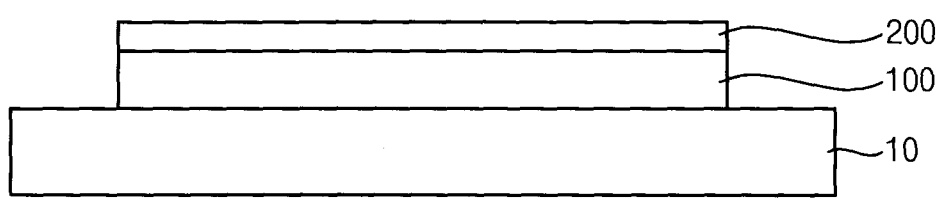
Figure 1D:
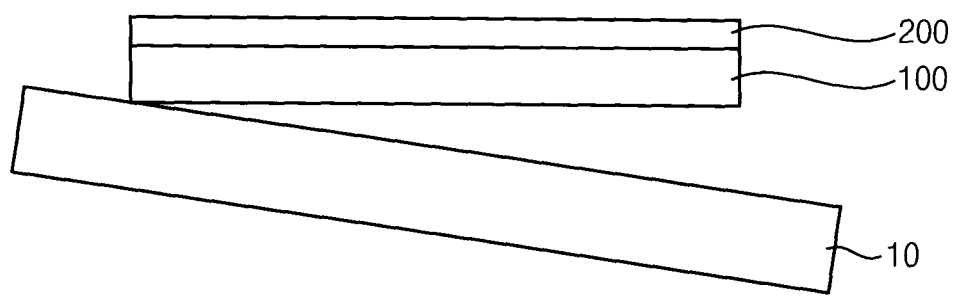
Figure 1E:
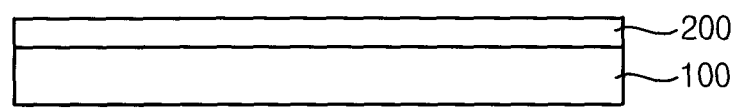

Referring to FIGS. 1A to 1E, a carrier substrate 10 is provided (FIG. 1A). A flexible substrate 100 is laminated on the carrier substrate 10 (FIG. 1B). An adhesive layer 200 is formed (e.g., provided) on the flexible substrate 100 (FIG. 1C). The carrier substrate 10 and the flexible substrate 100 are separated from each other (FIG. 1D). The adhesive layer 200 may remain on the flexible substrate (FIG. 1E).

The carrier substrate 10 may be a glass substrate.

The flexible substrate 100 may be a plastic substrate.

In an exemplary embodiment, for example, the plastic substrate may include a polyimide film such as Kapton® (DuPont™), polyethersulphone ("PES"), polycarbonate ("PC"), polyimide ("PI"), polyethyleneterephthalate ("PET"), polyethylenenaphthalate ("PEN"), polyacrylate ("PAR"), fiber reinforced plastic ("FRP") or the like.

The flexible substrate 100 may include PI.

The flexible substrate 100 may have a thin-film form. In one exemplary embodiment, for example, a cross-sectional thickness of the flexible substrate 100 may be within a range of about 5 micrometers (μm) to about 200 μm.

When the cross-sectional thickness of the flexible substrate 100 is less than 5 μm, strength of the flexible substrate 100 is excessively low, so that the flexible substrate 100 may not support a display element of a display panel. When the cross-sectional thickness of the flexible substrate 100 is more than 200 μm, a flexibility of the flexible substrate 100 may decrease.

An inorganic material may be deposited to the flexible substrate 100, thereby forming the adhesive layer 200, but the invention is not limited thereto.

In an exemplary embodiment, for example, the inorganic material may be deposited by sputtering, atomic layer deposition, molecular layer deposition or chemical vapor deposition.

The adhesive layer 200 may include an inorganic oxide.

The inorganic oxide may include silicon oxide. In an exemplary embodiment, for example, the inorganic oxide may be silicon dioxide ($SiO_2$).

The inorganic oxide may be a metal oxide. In an exemplary embodiment, for example, the inorganic oxide may be aluminum oxide, gallium oxide, zinc oxide, titanium dioxide, indium oxide, indium tin oxide ("ITO"), indium zinc oxide ("IZO"), gallium indium zinc oxide ("GIZO"), a combination thereof, or the like.

The inorganic material for the adhesive layer 200 may be deposited in a conventional process condition.

In an exemplary embodiment, for example, the inorganic material may include a silicon atom. The inorganic material may be provided with a source of oxygen. The inorganic material and the oxygen may form the adhesive layer composed of $SiO_2$ through a thermal oxidation process. Alternatively, the inorganic material may be silane ($SiH_4$), dichlorosilane ($SiH_2Cl_2$) or the like. The inorganic material may be provided with a source of oxygen ($O_2$) or nitrogen oxide ($N_2O$).

The inorganic material included in the adhesive layer 200 may be strongly combined with the flexible substrate 100.

A surface of the adhesive layer 200 may be hydrophilic. In an exemplary embodiment, for example, the surface of the adhesive layer 200 may include a hydroxyl group (—OH).

The hydroxyl group (—OH) may be chemically bonded with the silicon atom (Si), which is included in the adhesive layer 200. Alternatively, the hydroxyl group (—OH) may be chemically bonded with a metal atom (M), which is included in the adhesive layer 200.

A ratio of the hydroxyl group (—OH) in the adhesive layer 200 may be modified by controlling a concentration of water molecules ($H_2O$) or hydrogen molecules ($H_2$) during deposition of the adhesive layer 200.

A surface of the adhesive layer 200 may be modified to form the hydroxyl group (—OH) on the surface of the adhesive layer 200. The surface at which is formed the hydroxyl group (—OH) may be a surface which will be used to bond to a glass substrate for forming a display panel.

The hydroxyl group (—OH) may be formed by a reduction process on the surface of the adhesive layer 200. Alternatively, the hydroxyl group (—OH) may be formed by the addition of a hydrogen atom to an oxygen atom included in an inorganic oxide present at the surface of the adhesive layer.

The surface of the adhesive layer 200 may be modified by a conventional method. In an exemplary embodiment, for example, the surface of the adhesive layer 200 may be modified by a reduction process by an acid treatment or a base treatment, a modifying process by plasma treatment, etc. In an exemplary embodiment, for example, a combination of sulfuric acid and hydrogen peroxide may be provided to the adhesive layer 200 formed by depositing a silicon oxide, so that the hydroxyl group (—OH) may be formed on the surface of the adhesive layer 200.

In an exemplary embodiment, for example, the surface of the adhesive layer 200 may include at least 5 hydroxyl groups (—OH) in 1 square nanometer ($nm^2$). Alternatively, the surface of the adhesive layer 200 may include about 1 to about 4 hydroxyl groups (—OH) in 1 $nm^2$.

In an exemplary embodiment, for example, a cross-sectional thickness of the adhesive layer 200 may be within a range of about 10 angstroms (Å) to about 5,000 Å.

When the cross-sectional thickness of the adhesive layer 200 is less than 10 Å, an adhesive strength of the flexible substrate 100 decreases. When the cross-sectional thickness of the adhesive layer 200 is more than 5000 Å, the adhesive strength of the flexible substrate 100 may not be improved.

In an exemplary embodiment, for example, a surface roughness of the adhesive layer 200 is less than or equal to 5 nanometers (nm).

When the surface roughness of the adhesive layer 200 is more than 5 nm, the adhesive strength thereof decreases. Thus, forming a heat-treated layer with respect to the adhesive layer 200 may be difficult.

The separating the carrier substrate 10 and the flexible substrate 100 from each other (FIG. 1D) provides the flexible substrate 100 having the adhesive layer 200 thereon (FIG. 1E). In an exemplary embodiment, for example, the carrier substrate 10 and the flexible substrate 100 may be separated from each other by a mechanical separation, such as by using an adhesive tape, etc.

Figure 2A:
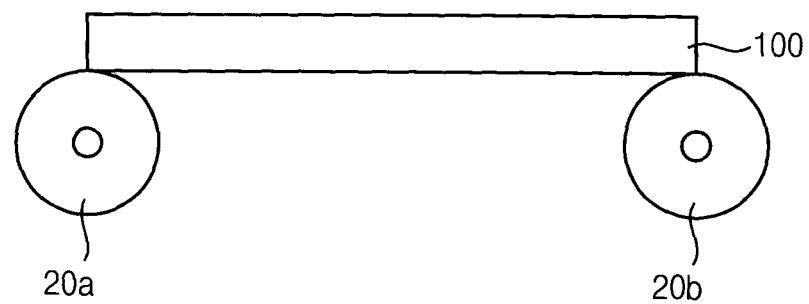
FIGS. 2A and 2B are cross-sectional views illustrating another exemplary embodiment of a method of forming an adhesive layer on a flexible substrate.
Figure 2B:
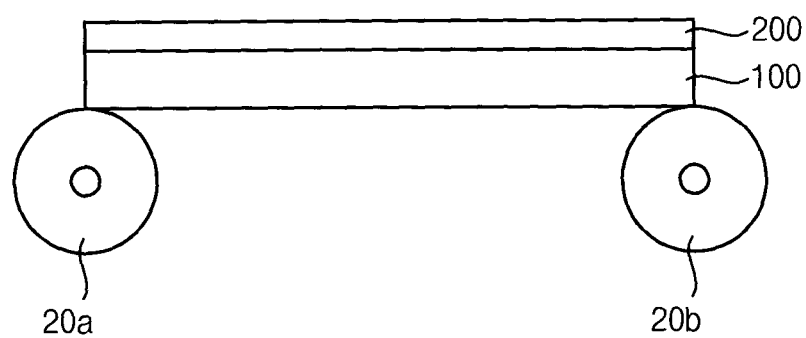

FIGS. 2A and 2B are cross-sectional views illustrating another exemplary embodiment of a method of forming an adhesive layer on a flexible substrate.

A flexible substrate and an adhesive layer according to the exemplary embodiment illustrated in FIGS. 2A and 2B are substantially the same as the flexible substrate and the adhesive layer illustrated in FIGS. 1A to 1E. Thus, any repetitive explanation concerning the same elements will be omitted.

Referring to FIGS. 2A and 2B, an adhesive layer 200 may be formed on a flexible substrate 100 by a roll-to-roll process.

In an exemplary embodiment, for example, a first roller 20a and a second roller 20b may rotate, so that the flexible substrate 100 may be unwound, such as from a master roll of flexible substrate material (FIG. 2A). The adhesive layer 200 may be formed on the flexible substrate 100 (FIG. 2B). An unnecessary part and/or remaining part of the flexible substrate material may be removed, thereby forming the flexible substrate 100. A desired portion of the flexible substrate material which will form the flexible substrate 100 may remain attached to a remainder of the master roll while the adhesive layer 200 is formed on the desired portion of the flexible substrate material, but the invention is not limited thereto.

Figure 3:
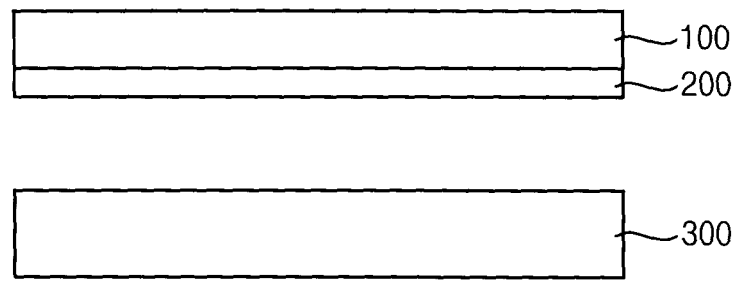
FIGS. 3 to 5 are cross-sectional views illustrating an exemplary embodiment of a method of manufacturing a flexible display panel.
Figure 4:
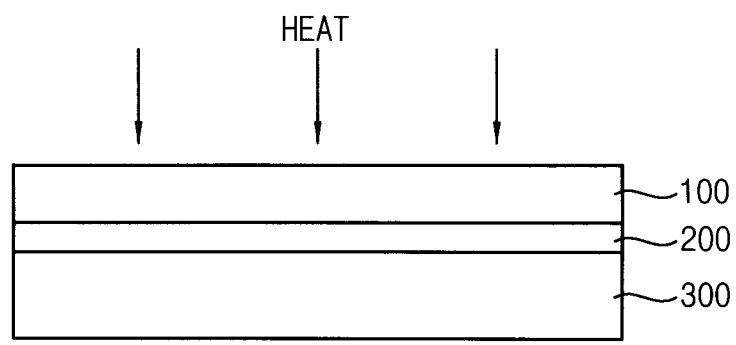
Figure 5:
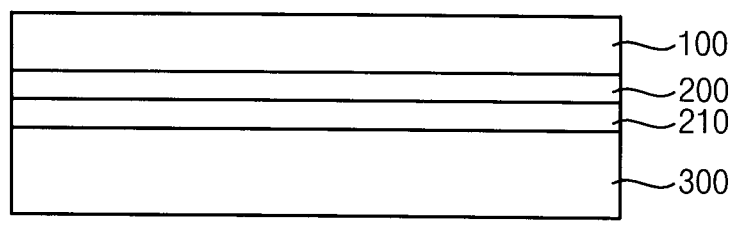
Figure 6A:
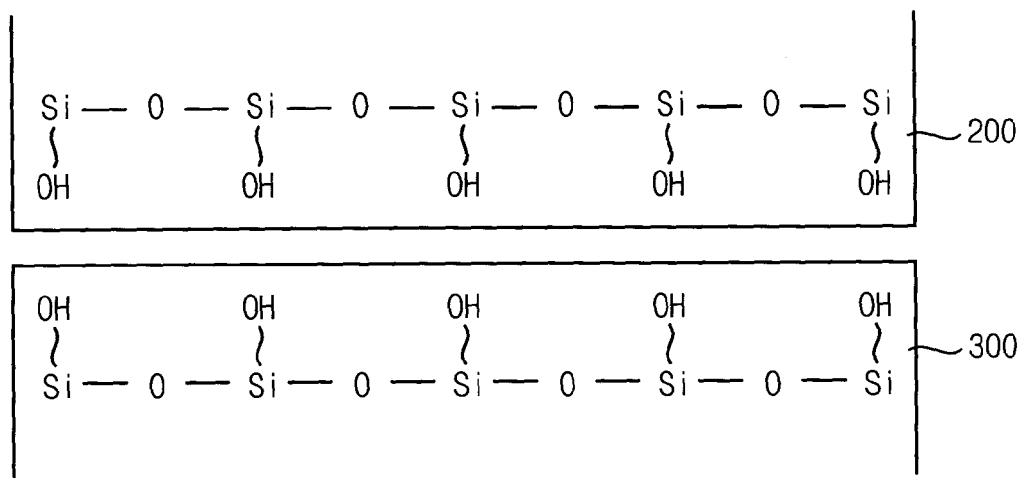
FIGS. 6A and 6B are cross-sectional views illustrating an exemplary embodiment of a method of forming a heat-treated layer.
Figure 6B:
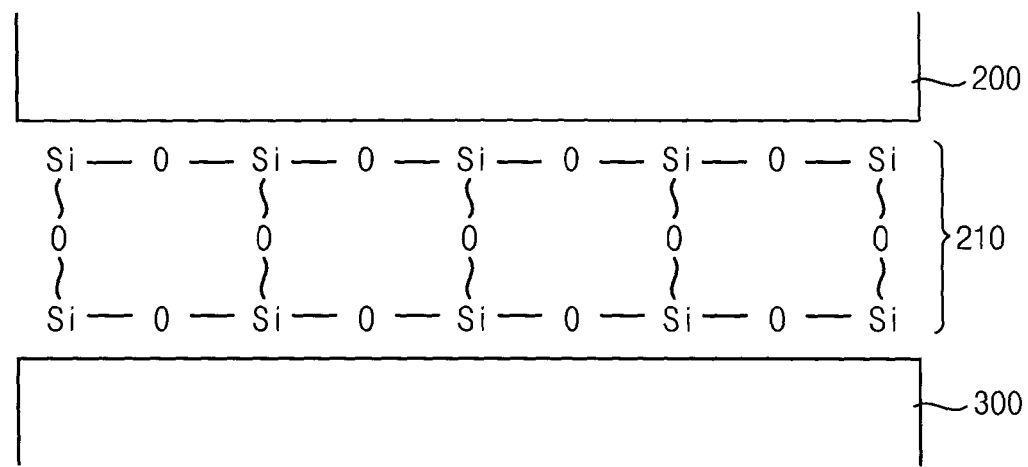
Figure 7A:
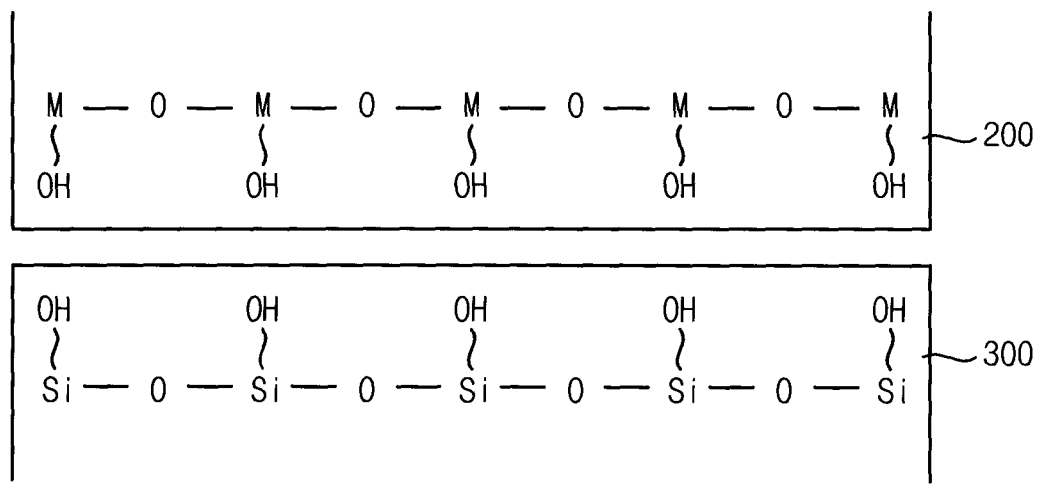
FIGS. 7A and 7B are cross-sectional views illustrating another exemplary embodiment of a method of forming a heat-treated layer.
Figure 7B:
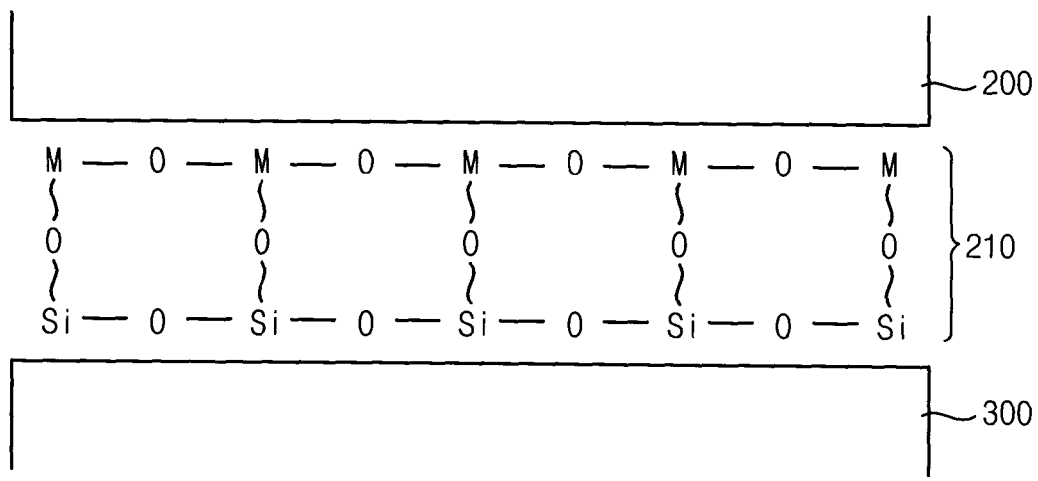

FIGS. 3 to 5 are cross-sectional views illustrating an exemplary embodiment of a method of manufacturing a flexible display panel. FIGS. 6A and 6B are cross-sectional views illustrating an exemplary embodiment of a method of forming a heat-treated layer. FIGS. 7A and 7Bb are cross-sectional views illustrating another exemplary embodiment of a method of forming a heat-treated layer.

Referring to FIGS. 1 to 5, a glass substrate 300 is provided. The adhesive layer 200 on the flexible substrate 100 may be laminated to the glass substrate 300. The glass substrate 300, and/or the flexible substrate 100 including the adhesive layer 200 thereon, is heated to form a heat-treated layer 210.

The flexible substrate 100 is relatively thin. Thus, since the flexible substrate 100 is relatively thin, proceeding with a plurality of thin-film processes thereon, such as for forming thin-film transistors, display elements, etc., may be difficult. Furthermore, the relatively thin flexible substrate 100 may be easily bent, such that it may be difficult to securely support the display elements, etc., on the flexible substrate 100.

Therefore, the relatively flexible substrate 100 may be disposed on the glass substrate 300 to proceed with the thin-film processes performed on the flexible substrate 100.

The glass substrate 300 includes silicon dioxide ($SiO_2$).

A surface of the glass substrate 300 may be hydrophilic. The surface of the glass substrate 300 may include a hydroxyl group (—OH). The hydroxyl group (—OH) may react with a silicon atom included in the glass substrate 300.

The flexible substrate 100 having the adhesive layer 200 thereon, may be laminated on an upper surface of the glass substrate 300.

The adhesive layer 200 may be disposed between the flexible substrate 100 and the glass substrate 300, by providing the flexible substrate 100 to the glass substrate 300.

Thus, the flexible substrate 100 and the glass substrate 300 may be adhered to each other. Surfaces of the adhesive layer 200 and the glass substrate 300 face each other.

The adhesive layer 200 and the glass substrate 300 may be heated, so that a heat-treated layer 210 may be formed. In an exemplary embodiment, for example, heat is applied such that the adhesive layer 200 and the glass substrate 300 may be heated to a temperature of about 100 degrees Celsius (° C.) to about 450° C. to form the heat-treated layer 210. The heat may be applied to one side of the layered structure including the flexible substrate 100, the adhesive layer 200 and the glass substrate 300, as illustrated in FIG. 4, but the invention is not limited thereto. The heat may be applied in any direction and by any method such that both the adhesive layer 200 and the glass substrate 300 are heated to the proper temperature. The adhesive layer 200 and the glass substrate 300 may be heated individually to reach the proper temperature, or may be heated collectively to reach the proper temperature.

When the adhesive layer 200 and the glass substrate 300 are heated, a hydroxyl group (—OH) at the facing surface of the adhesive layer 200 and a hydroxyl group (—OH) at the facing surface of the glass substrate 300, may react.

Referring to FIGS. 6A and 6B, the glass substrate 300 includes silicon dioxide ($SiO_2$), and the facing surface of the glass substrate 300 includes the hydroxyl group (—OH) attached to the silicon (Si) atom. The facing surface of the adhesive layer 200 also includes the hydroxyl group (—OH), attached to silicon (Si) atoms.

The adhesive layer 200 and the glass substrate 300 may be heated to react the hydroxyl group (—OH) included at the facing surface of the adhesive layer 200 with the hydroxyl group (—OH) included at the facing surface of the glass substrate 300. Two hydroxyl groups react by a dehydration reaction thereby forming a chemical bond (FIG. 6B).

The heat-treated layer 210 may include a chemical bond formed by sequential combination of a silicon atom (Si), an oxygen atom (O) and a silicon atom (Si). A relatively strong adhesive strength between the flexible substrate 100 and the glass substrate 300 may be maintained by the chemical bond (Si—O—Si) in the heat-treated layer 210. The heat-treated layer 210 may be considered a discrete layer between the adhesive layer 200 and the glass substrate 300, or may be considered as a portion of one or both the adhesive layer 200 and the glass substrate 300.

Furthermore, the chemical bond may be stable at a process temperature of about 500° C.

Thus, an adhesive strength between the adhesive layer 200 and the glass substrate 300 may be stable by the heat-treated layer 210 including the chemical bond.

Referring to FIGS. 7A and 7B, the glass substrate 300 includes silicon dioxide ($SiO_2$), and the facing surface of the glass substrate 300 includes the hydroxyl group (—OH) attached to silicon (Si). The facing surface of the adhesive layer 200 includes the hydroxyl group (—OH) combined with a metal (M).

The adhesive layer 200 and the glass substrate 300 may be heated to react the hydroxyl group (—OH) included at the facing surface of the adhesive layer 200 with the hydroxyl group (—OH) included at the facing surface of the glass substrate 300. Two hydroxyl groups react by a dehydration reaction thereby forming a chemical bond.

The heat-treated layer 210 may include a chemical bond formed by sequential combination of a silicon atom (Si), an oxygen atom (O) and a metal atom (M). A strong adhesive strength may be maintained between the flexible substrate 100 and the glass substrate 300 by the chemical bond (Si—O—M).

Furthermore, the chemical bond may be stable at a process temperature of about 500° C.

Thus, an adhesive strength between the adhesive layer 200 and the glass substrate 300 may be stable by the heat-treated layer 210 including the chemical bond.

FIGS. 8 to 12 are cross-sectional views illustrating another exemplary embodiment of a method of manufacturing a flexible display panel. An overall method of forming a flexible display panel may include the methods of the exemplary embodiments of FIGS. 8 to 12 and FIGS. 3 to 7B, but the invention is not limited thereto.

Figure 8:
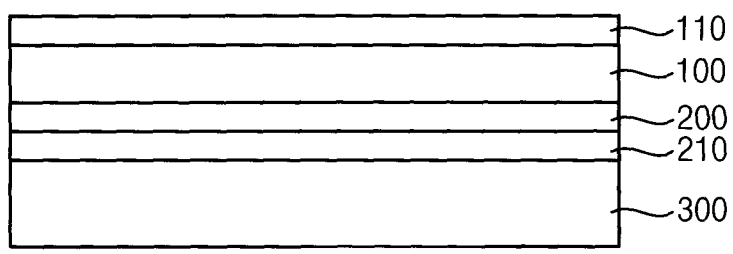
FIGS. 8 to 12 are cross-sectional views illustrating another exemplary embodiment of a method of manufacturing a flexible display panel.
Figure 9:
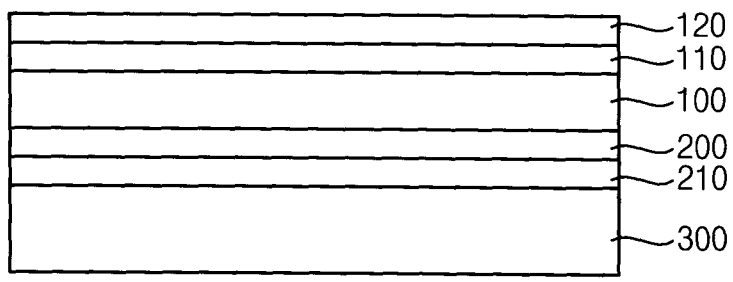

Referring to FIGS. 8 and 9, a display layer 110 of the flexible display panel may be formed on the flexible substrate 100. An encapsulating layer 120 of the flexible display panel may be formed on the display layer 110. The flexible substrate 110 of the flexible display panel may be attached to the glass substrate 300 via the adhesive layer 200 and the heat-treated layer 210, during the forming the display layer 110 on the flexible substrate 100 and/or during the forming the encapsulating layer 120 on the display layer 110.

The display layer 110 may include a display element.

In an exemplary embodiment, for example, the display element may include an organic light emitting diode display element ("OLED"), a liquid crystal display element ("LCD") or an electrophoresis display element ("EPD").

The encapsulating layer 120 may be formed on the display layer 110 to cover the display layer 110, such as overlapping an entire of the display layer 110.

The encapsulating layer 120 may include an organic material and/or an inorganic material.

The encapsulating layer 120 may be formed in a single layer or a multi layer. An organic layer including the organic material and an inorganic layer including the inorganic material may be laminated repetitively to form the multi layer.

The organic material may include a polymer. In an exemplary embodiment, for example, the polymer may be an acryl resin, an epoxy resin, a polyimide, a polyethylene, etc.

The inorganic material may include an inorganic oxide. In an exemplary embodiment, for example, the inorganic oxide may be aluminum oxide, titanium oxide, zirconium oxide, silicon oxide, aluminum nitride, silicon oxynitride, aluminum oxynitride, silicon nitride, zinc oxide, tantalum oxide, etc.

The inorganic material may include a plurality of thin-films, which has a relatively high density. Thus, the inorganic material may protect permeation of moisture and oxygen to elements in the display layer 110. The moisture and oxygen may be also blocked from reaching the elements in the display layer 110, by the organic layer. The organic layer has a relatively smaller humidity-blocking-effect than the inorganic layer, but the organic layer may buffer layers within the encapsulating layer 120 against a stress of other layers to decrease the overall stress within the flexible display panel. Thus, flexibility of a flexible display apparatus including the flexible display panel may be maintained.

The organic layer of the encapsulating layer 120 has a substantially flat (e.g., planarized) surface. When the encapsulating layer 120 has a plurality of layers, the organic layer may be disposed to define an upper surface of the encapsulating layer 120, thereby flattening or planarizing the encapsulating layer 120.

A cross-sectional thickness of the encapsulating layer 120 may be less than about 10 μm, to minimize an overall thickness of the flexible display apparatus. Thus, the flexible display apparatus including the flexible display panel may be relatively thin.

Figure 10:
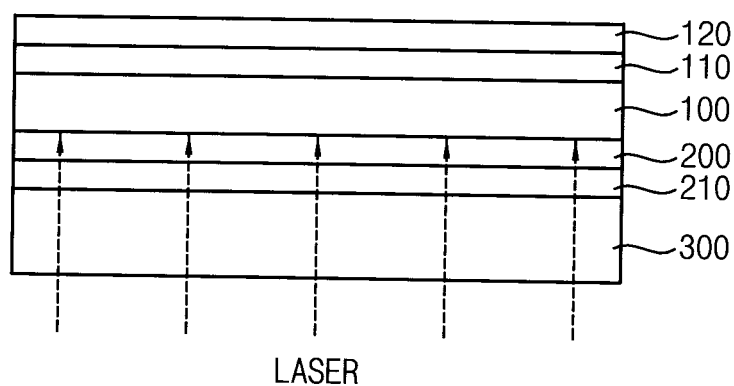
Figure 11:
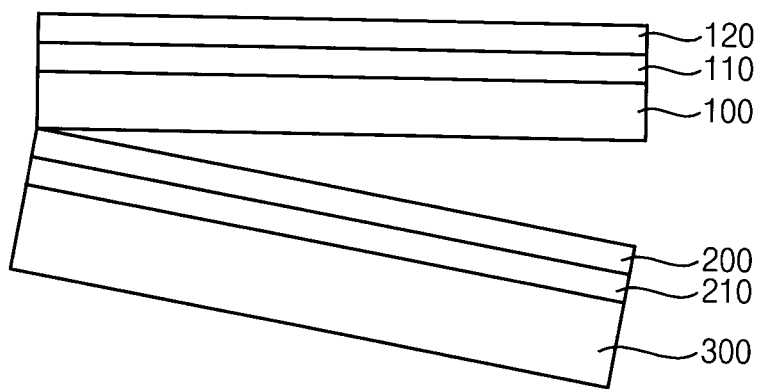
Figure 12:

Referring to FIGS. 10 to 12, the flexible substrate 100 may be separated from the adhesive layer 200, after the encapsulating layer 120 is formed. The separating the flexible substrate 100 from the adhesive layer 200 also separates the flexible substrate 100 from the heat-treated layer 210 and the glass substrate 300 which are coupled to the adhesive layer 200.

Referring to FIG. 10, the flexible substrate 100 and the adhesive layer 200 may be separated, such as by irradiating a laser.

A light source of the laser may be disposed adjacent to the glass substrate 300, but the invention is not limited thereto. The laser may be focused on a border surface defined between the flexible substrate 100 and the adhesive layer 200.

A strength of the laser and/or a depth of focus may be controlled thereby focusing light to the border surface defined between the flexible substrate 100 and the adhesive layer 200.

The laser irradiated to the flexible substrate 100 is absorbed by the flexible substrate 100. Thus, molecules of the flexible substrate 100 adjacent to the surface of the flexible substrate 100 at the border surface, may be decomposed. These molecules of the flexible substrate 100 may be decomposed by energy of the laser, so that an adhesive strength between the flexible substrate 100 and the adhesive layer 200 may decrease. Therefore, with a decreased adhesive strength between the flexible substrate 100 and the adhesive layer 200, separation of the flexible substrate 100 and the adhesive layer 200 from each other may be promoted.

In an exemplary embodiment, for example, the laser may be an excimer laser having a wavelength of about 308 nm. The excimer laser may include xenon chloride (XeCl). The xenon chloride may generate light having a wavelength of about 308 nm.

Referring to FIG. 11, the flexible substrate 100 and the adhesive layer 200 may be mechanically separated such as by applying force to the flexible substrate 100 and the adhesive layer 200, in opposite directions. In an exemplary embodiment, to apply the force, a vacuum state or vacuum apparatus may be used.

In another exemplary embodiment, to apply the force, an adhesive member such as tape may be used to separate the flexible substrate 100 from the glass substrate 300.

The mechanical separation may be difficult when an adhesive strength between the flexible substrate 100 and the adhesive layer 200 is more than or equal to about 30 grams-force per square centimeter ($gf/cm^2$).

A ratio of the hydroxyl group (—OH) in the adhesive layer 200 may be controlled by controlling a concentration of water molecules ($H_2O$) or hydrogen molecule ($H_2$) during depositing adhesive layer material in the forming of the adhesive layer 200. In an exemplary embodiment, the facing surface of the adhesive layer 200 may include at least 5 hydroxyl groups (—OH) in 1 $nm^2$, but the invention is not limited thereto. Therefore, when the facing surface of the adhesive layer 200 may include at least 5 hydroxyl groups (—OH) in 1 $nm^2$, the adhesive strength between the flexible substrate 100 and the adhesive layer 200 may be more than or equal to 30 $gf/cm^2$.

Furthermore, in an exemplary embodiment, the facing surface of the adhesive layer 200 may include about 1 to about 4 hydroxyl groups (—OH) in 1 nm². When the facing surface of the adhesive layer 200 includes about 1 to about 4 hydroxyl groups (—OH) in 1 nm², adhesive strength between the flexible substrate 100 and the adhesive layer 200 may be less than about 30 gf/cm². Thus, the flexible substrate 100 may be separated from the adhesive layer 200 by the mechanical separation.

Alternatively, when the flexible substrate 100 and the glass substrate 300 are mechanically separated, the adhesive layer 200 and the heat-treated layer 210 may be separated from each other and/or the flexible substrate 100.

Although exemplary embodiments have been described, it is understood that the invention should not be limited to these exemplary embodiments and various changes and modifications can be made by one of those ordinary skilled in the art within the spirit and scope as hereinafter claimed.

The foregoing is illustrative of the invention and is not to be construed as limiting thereof. Although a few exemplary embodiments of the invention have been described, those skilled in the art will readily appreciate that many modifications are possible in the exemplary embodiments without materially departing from the novel teachings and advantages of the invention. Accordingly, all such modifications are intended to be included within the scope of the invention as defined in the claims. In the claims, means-plus-function clauses are intended to cover the structures described herein as performing the recited function and not only structural equivalents but also equivalent structures. Therefore, it is to be understood that the foregoing is illustrative of the invention and is not to be construed as limited to the specific exemplary embodiments disclosed, and that modifications to the disclosed exemplary embodiments, as well as other exemplary embodiments, are intended to be included within the scope of the appended claims. The invention is defined by the following claims, with equivalents of the claims to be included therein.

What is claimed is:

1. A method of manufacturing a flexible display panel, comprising:
   forming an adhesive layer, comprising:
      depositing an inorganic material layer directly on a flexible substrate; and
      forming a hydroxyl group at a surface of the inorganic material layer opposite to the surface directly on the flexible substrate, by modifying said opposite surface of the inorganic material layer, to form the adhesive layer which is directly on the flexible substrate and for which a surface thereof is modified to include the hydroxyl group;
   with the adhesive layer directly on the flexible substrate and for which a surface thereof is modified to include the hydroxyl group, laminating a glass substrate to the adhesive layer at the modified surface of the adhesive layer to dispose the adhesive layer directly on the glass substrate and the flexible substrate; and
   with the adhesive layer directly on the glass substrate and the flexible substrate, subsequently forming a heat-treated layer between the modified surface of the adhesive layer and a facing surface of the glass substrate, by heating the glass substrate to which the adhesive layer directly on the flexible substrate is laminated to form the heat-treated layer including a Si—O—Si bond or a Si—O-M bond, where M represents a metal atom.

2. The method of manufacturing flexible display panel of claim 1, wherein the forming of the adhesive layer comprises:
   laminating the flexible substrate to a carrier substrate;
   depositing the inorganic material layer directly to the flexible substrate laminated to the carrier substrate, to form the adhesive layer; and
   separating the flexible substrate with the adhesive layer directly thereon, from the carrier substrate.

3. The method of manufacturing flexible display panel of claim 1, wherein the forming of the adhesive layer comprises:
   unwinding flexible substrate material for the flexible substrate, from a first roller;
   depositing the inorganic material directly to the unwound flexible substrate material, to form the adhesive layer; and
   winding the flexible substrate material with the adhesive layer directly thereon, to a second roller.

4. The method of claim 1, wherein the inorganic material layer comprises silicon oxide.

5. The method of claim 1, wherein the inorganic material layer is selected from aluminum oxide, gallium oxide, zinc oxide, titanium dioxide, indium oxide, indium tin oxide, indium zinc oxide, gallium indium zinc oxide and a combination thereof.

6. The method of claim 5, wherein a thickness of the adhesive layer is within a range of about 10 angstroms to about 5,000 angstroms.

7. The method of claim 1, wherein a surface roughness of the adhesive layer is less than about 5 nanometers.

8. The method of claim 1, wherein a processing temperature of the forming of the heat-treated layer is within a range of about 100 degrees Celsius to about 450 degrees Celsius.

9. The method of claim 1, further comprising:
   separating the flexible substrate from the adhesive layer.

10. The method of claim 9, wherein the modified surface of the adhesive layer comprises 5 hydroxyl groups in 1 square nanometer.

11. The method of claim 10, wherein the flexible substrate and the adhesive layer are separated by irradiation from a laser.

12. The method of claim 9, wherein the modified surface of the adhesive layer comprises hydroxyl groups within a range of about 1 hydroxyl group to about 4 hydroxyl groups in 1 square nanometer.

13. The method of claim 12, wherein an adhesive strength between the flexible substrate and the adhesive layer is less than about 30 grams-force per square centimeter.

14. The method of claim 13, wherein the flexible substrate and the adhesive layer are separated by applying force in opposite directions with a vacuum state.

15. A method of manufacturing a flexible display apparatus, comprising:
   forming an adhesive layer, comprising:
      depositing an inorganic material layer directly on a first surface of a flexible substrate; and
      forming a hydroxyl group at a surface of the inorganic material layer opposite to the surface directly on the first surface of the flexible substrate, by modifying said opposite surface of the inorganic material layer to form the adhesive layer which is directly on the flexible substrate and for which a surface thereof is modified to include the hydroxyl group;

with the adhesive layer directly on the first surface of the flexible substrate and for which a surface thereof is modified to include the hydroxyl group, laminating a glass substrate to the adhesive layer at the modified surface of the adhesive layer to dispose the adhesive layer directly on the glass substrate and the flexible substrate;

with the adhesive layer directly on the glass substrate and the flexible substrate, subsequently forming a heat-treated layer between the first surface of the flexible substrate and the glass substrate, by heating the glass substrate to which the adhesive layer directly on the flexible substrate is laminated to form the heat-treated layer including a Si—O—Si bond or a Si—O-M bond, where M represents a metal atom; and forming a display layer comprising a display element, on a second surface of the flexible substrate opposite to the first surface, with the heat-treated layer between the first surface of the flexible substrate and the glass substrate.

16. The method of claim 15, further comprising:
forming an encapsulating layer on the display layer to cover the display element, with the heat-treated layer between the first surface of the flexible substrate and the glass substrate.

17. The method of claim 16, further comprising:
separating the flexible substrate and the adhesive layer, after forming the encapsulating layer.

18. The method of claim 15, wherein the inorganic material layer comprises silicon oxide.

19. The method of claim 15, wherein the inorganic material layer comprises aluminum oxide, gallium oxide, zinc oxide, titanium dioxide, indium oxide, indium tin oxide, indium zinc oxide, gallium indium zinc oxide or a combination thereof.

20. The method of claim 15, wherein the display element comprises an organic emitting display element, a liquid crystal display element or an electrophoresis display element.

* * * * *